US010157703B2

(12) United States Patent
Yosui

(10) Patent No.: US 10,157,703 B2
(45) Date of Patent: Dec. 18, 2018

(54) INDUCTOR ELEMENT, INDUCTOR BRIDGE, HIGH-FREQUENCY FILTER, HIGH-FREQUENCY CIRCUIT MODULE, AND ELECTRONIC COMPONENT

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 108 days.

(21) Appl. No.: 14/841,792

(22) Filed: Sep. 1, 2015

(65) Prior Publication Data
US 2015/0371761 A1 Dec. 24, 2015

Related U.S. Application Data

(63) Continuation of application No. PCT/JP2014/057976, filed on Mar. 24, 2014.

(30) Foreign Application Priority Data

Apr. 16, 2013 (JP) ................................. 2013-085945

(51) Int. Cl.
*H01F 5/00* (2006.01)
*H01F 27/28* (2006.01)
(Continued)

(52) U.S. Cl.
CPC ..... *H01F 27/2804* (2013.01); *H01F 17/0006* (2013.01); *H01Q 1/50* (2013.01);
(Continued)

(58) Field of Classification Search
CPC ................. H01F 27/2804; H01F 27/28; H01F 2027/2809; H01F 2017/006;
(Continued)

(56) References Cited

U.S. PATENT DOCUMENTS

2009/0009415 A1* 1/2009 Tanska ............... G06K 7/10336
343/742
2010/0321267 A1* 12/2010 Ito ............................ H01Q 7/08
343/788

(Continued)

FOREIGN PATENT DOCUMENTS

JP 58-141513 A 8/1983
JP 09-283335 A 10/1997
(Continued)

OTHER PUBLICATIONS

Official Communication issued in International Patent Application No. PCT/JP2014/057976, dated Jun. 24, 2014.

*Primary Examiner* — Mangtin Lian
(74) *Attorney, Agent, or Firm* — Keating & Bennett, LLP

(57) ABSTRACT

An inductor element includes a resin substrate which is an insulating substrate including conductor patterns, and coils defined by the conductor patterns. Two coils are arranged on the same plane, and connected in series. Adjacent coils define a closed magnetic circuit. That is, the winding direction and the connection of the coils are determined such that magnetic flux that interlinks coils that are adjacent in the planar direction define a loop. There are also provided an inductor bridge and a high-frequency filter that include the inductor element.

16 Claims, 14 Drawing Sheets

(51) Int. Cl.
*H01F 21/02* (2006.01)
*H03H 7/01* (2006.01)
*H01F 17/00* (2006.01)
*H01Q 1/50* (2006.01)
*H01Q 9/04* (2006.01)
*H03H 1/00* (2006.01)

(52) U.S. Cl.
CPC ............ *H01Q 9/04* (2013.01); *H03H 7/0115* (2013.01); *H03H 7/17* (2013.01); *H01F 2017/006* (2013.01); *H01F 2017/0073* (2013.01); *H01F 2027/2809* (2013.01); *H03H 2001/0078* (2013.01); *H03H 2001/0092* (2013.01)

(58) Field of Classification Search
CPC ............ H01F 2017/0073; H03H 7/17; H03H 7/0115; H03H 7/01; H03H 2001/0092; H03H 2001/0078; H01Q 1/50; H01Q 9/04

USPC ........ 336/182, 185, 200, 232, 147; 343/850; 333/185

See application file for complete search history.

(56) References Cited

U.S. PATENT DOCUMENTS

| | | | |
|---|---|---|---|
| 2011/0102123 A1 | 5/2011 | Hamano | |
| 2012/0029343 A1* | 2/2012 | Wasson | H01F 5/003 600/424 |
| 2013/0181805 A1* | 7/2013 | Saito | H01Q 1/2216 336/84 M |
| 2014/0184462 A1* | 7/2014 | Yosui | H01Q 7/06 343/788 |
| 2014/0218262 A1* | 8/2014 | Tsubaki | H01Q 7/00 343/867 |

FOREIGN PATENT DOCUMENTS

| | | |
|---|---|---|
| JP | 11-134459 A | 5/1999 |
| WO | 2010/016345 A1 | 2/2010 |

* cited by examiner

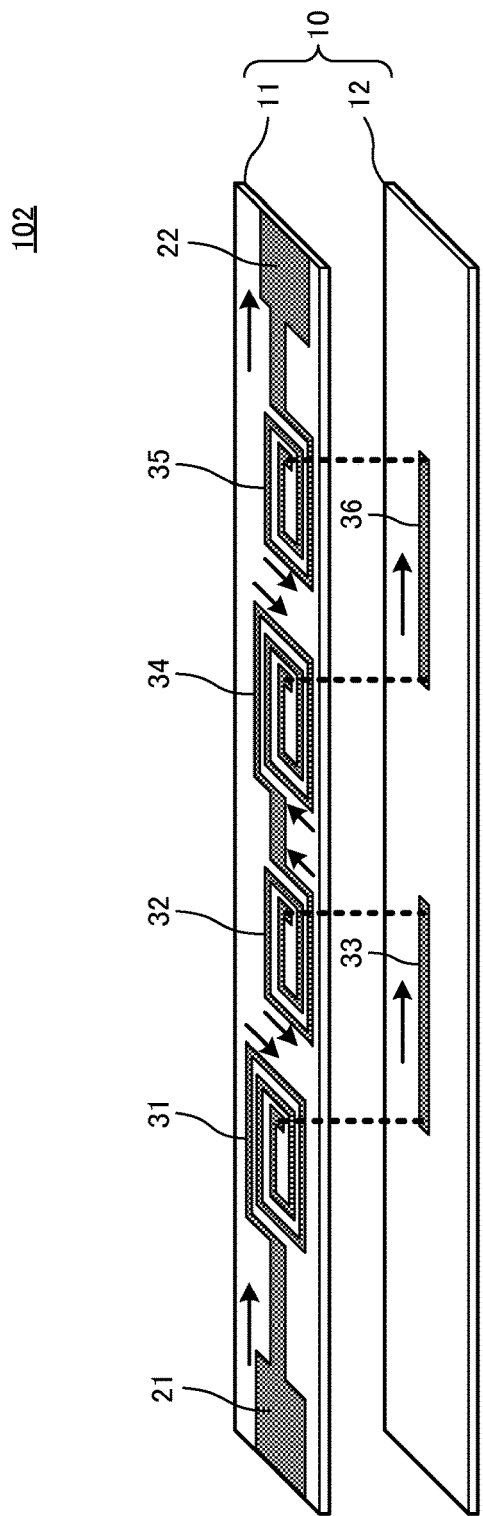

US 10,157,703 B2

INDUCTOR ELEMENT, INDUCTOR BRIDGE, HIGH-FREQUENCY FILTER, HIGH-FREQUENCY CIRCUIT MODULE, AND ELECTRONIC COMPONENT

BACKGROUND OF THE INVENTION

1. Field of the Invention

The present invention relates to an inductor element provided on an insulating substrate, and an inductor bridge and a high-frequency filter that include the inductor element.

2. Description of the Related Art

Hitherto, there has been a demand to reduce the thickness of various components to be provided in a circuit in thin and small electronic devices such as portable terminals. In addition, it has been required to elaborate the shape of various elements in order to dispose the various elements in a limited space.

A common inductor element is formed as a chip inductor to be mounted on a circuit substrate, or incorporated into a circuit by forming a conductor pattern of an inductor on a circuit substrate. For example, International Publication No. 2010/016345 teaches a multilayer inductor that includes a plurality of insulating layers having a coil formed from a conductor pattern.

While it is possible to reduce the size of a chip inductor and a pattern inductor by forming finer conductor patterns or by forming conductor patterns in a multiplicity of layers, such a size reduction involves the following issues.

The direct-current resistance (DCR) is increased along with a reduction in line width of the conductor patterns.

An increase in interline capacitance and interlayer capacitance increases the floating capacitance per obtained inductance, which lowers the self-resonant frequency. Thus, the frequency band that allows use as an inductor is narrowed. For example, the bandwidth that allows use as a high-frequency filter is narrowed.

SUMMARY OF THE INVENTION

Accordingly, preferred embodiments of the present invention provide an inductor element having a small DCR and a high self-resonant frequency regardless of its small size and small thickness, and an inductor bridge and a high-frequency filter that include the inductor element.

A preferred embodiment of the present invention provides an inductor element including an insulating substrate including a conductor pattern; and a coil defined by the conductor pattern, in which the coil includes a plurality of coils arranged on an identical plane and connected in series, a winding direction and a connection of the coils are determined such that coils that are adjacent on the identical plane define a closed magnetic circuit (a magnetic flux that interlinks coils that are adjacent in the planar direction define a loop), and the insulating substrate is bent such that an interior angle between coils that are adjacent in a planar direction is in a range of 180° to 90°, for example.

According to the configuration described above, characteristic variations due to the bend are reduced compared to a case where the inductor element is defined by a single coil. In addition, the effect obtained by defining a closed magnetic circuit is maintained.

Preferably, the coils are provided over a plurality of layers as necessary. This contributes to significantly reducing the area required to define the inductor element.

Preferably, the inductor element further includes a line-segment conductor pattern that connects between coils among the plurality of coils, and the line-segment conductor pattern is provided in a layer that is different from a layer in which the coils connected by the line-segment conductor pattern are provided, and the insulating substrate is bent such that the line-segment conductor pattern is provided on an inner peripheral side with respect to the layer in which the coils connected by the line-segment conductor pattern are provided. Such a structure contributes to significantly reducing or preventing a break of the line-segment conductor pattern due to a tensile stress applied when the insulating substrate is bent.

Another preferred embodiment of the present invention also provides an inductor bridge including the inductor element according to one of the other preferred embodiments of the present invention described above; and a conductive member that is continuous with the inductor element.

A further preferred embodiment of the present invention further provides a high-frequency filter including the inductor element according to one of the other preferred embodiments of the present invention described above, in which a self-resonant frequency determined by an inductance and a floating capacitance generated by the plurality of coils is included in a rejection band.

According to various preferred embodiments of the present invention, the following effects are achieved.

A predetermined inductance is obtained with a short line length compared to a case where the inductor element is defined by a single coil, which reduces the direct-current resistance (DCR).

The required line length is shortened, which reduces the interline capacitance and the interlayer capacitance. Thus, the floating capacitance per obtained inductance is reduced, which enhances the self-resonant frequency. Thus, the frequency band that allows use as an inductor is widened to a higher range.

A closed magnetic circuit is defined to suppress expansion of a magnetic field. Thus, unwanted coupling due to a proximate conductor is significantly reduced or prevented. This allows the inductor element to be disposed in the vicinity of a conductor, which enhances the degree of freedom in arrangement. Thus, it is possible to further reduce the size and the thickness of the inductor element.

The degree of freedom in shape is enhanced compared to a case where the inductor element is defined by a single coil. Thus, it is easy to dispose the inductor element in a limited space.

The conductor pattern extends in the planar direction, which accordingly makes the inductor element thinner and easy to bend.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is an exploded perspective view of an inductor element according to a second preferred embodiment of the present invention.

DETAILED DESCRIPTION OF THE PREFERRED EMBODIMENTS

Preferred embodiments of the present invention will be described below by way of several specific examples. It should be understood that the preferred embodiments are exemplary, and that components included in different preferred embodiments may be partially replaced or combined to obtain other additional preferred embodiments.

First Preferred Embodiment

Figure 1A:
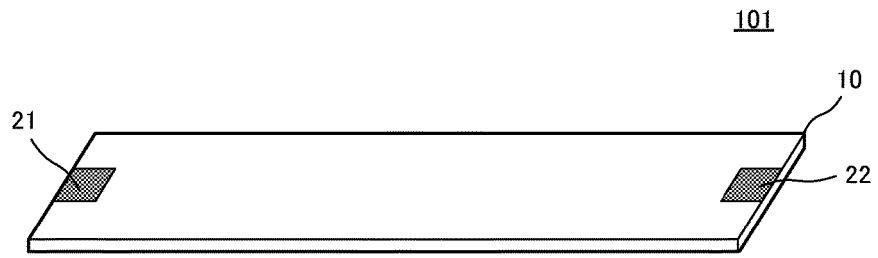
FIG. 1A is a perspective view illustrating the appearance of an inductor element according to a first preferred embodiment of the present invention.
Figure 1B:
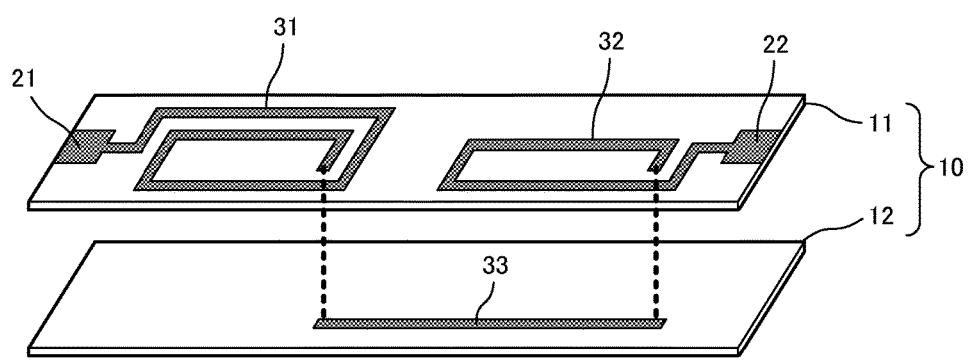
FIG. 1B is an exploded perspective view of the inductor element.
Figure 1C:
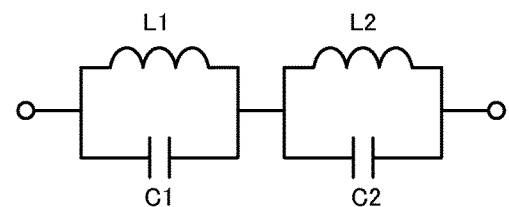
FIG. 1C is an equivalent circuit diagram of the inductor element.

FIG. 1A is a perspective view illustrating the appearance of an inductor element 101 according to a first preferred embodiment of the present invention. FIG. 1B is an exploded perspective view of the inductor element 101. It should be noted, however, that a resist film is not illustrated in FIG. 1B. FIG. 1C is an equivalent circuit diagram of the inductor element 101 according to the first preferred embodiment.

The inductor element 101 includes an element body 10 and terminal electrodes 21 and 22 provided on the element body 10, and is used with the terminal electrodes 21 and 22 connected to a predetermined circuit. The inductor element is preferably configured for use as a high-frequency filter, in particular a band rejection filter or a low-pass filter, for example.

As illustrated in FIG. 1B, the element body 10 is formed preferably by stacking resin substrates 11 and 12 made of a liquid crystal polymer (LCP), for example. Rectangular-spiral (coil-shaped) conductor patterns 31 and 32 are provided on the resin substrate 11. Coils defined by the conductor patterns 31 and 32 each have a coil axis that extends in a direction that is perpendicular or substantially perpendicular to a surface of the resin substrate 11 (in a direction that is perpendicular or substantially perpendicular to the principal surface of the element body 10). Using the liquid crystal polymer which is flexible and has a low relative dielectric constant in this way reduces the interline capacitance.

A line-segment conductor pattern 33 is provided on the resin substrate 12. A first end of the conductor pattern 33 is connected to an inner peripheral end of the conductor pattern 31 by a via conductor (interlayer connection conductor). A second end of the conductor pattern 33 is connected to an inner peripheral end of the conductor pattern 32 by a via conductor. A large portion of the conductor pattern 33 defines a coil together with the conductor pattern 32.

An outer peripheral end of the conductor pattern 31 is routed to the terminal electrode 21. An outer peripheral end of the conductor pattern 32 is routed to the terminal electrode 22.

In FIG. 1C, inductors L1 and L2 are equivalent to the inductance components of the conductor patterns 31 and 32, respectively. In addition, capacitors C1 and C2 are equivalent to the capacitances generated between the lines of the conductor patterns 31 and 32, respectively. The resulting LC circuit defines and functions as a band rejection filter.

Figure 2A:
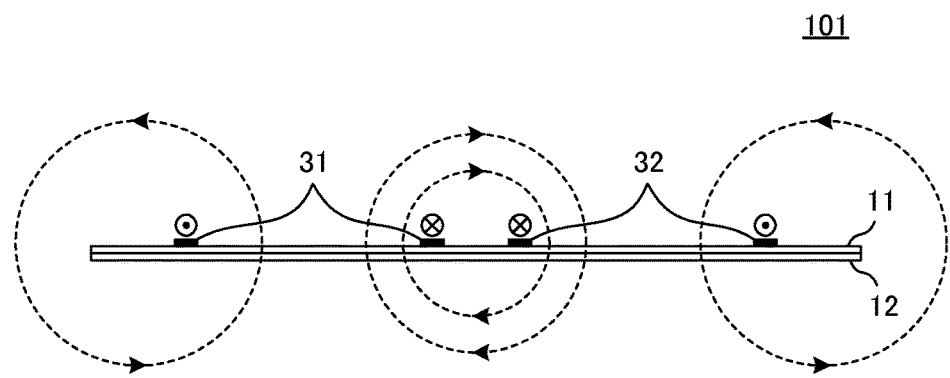
FIG. 2A is a sectional view illustrating the relationship between a current that flows through conductor patterns of the inductor element and a magnetic field generated by the current.
Figure 2B:
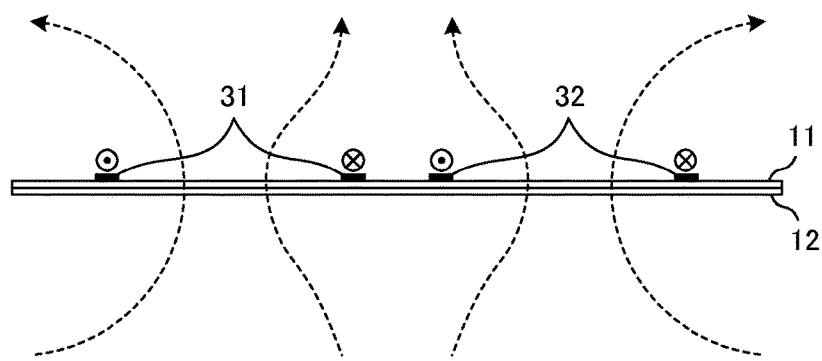
FIG. 2B is a sectional view illustrating the relationship between a current that flows through conductor patterns of an inductor element according to a comparative example and a magnetic field generated by the current.

FIG. 2A is a sectional view illustrating the relationship between a current that flows through conductor patterns of the inductor element 101 and a magnetic field generated by the current. FIG. 2B is a sectional view illustrating the relationship between a current that flows through conductor patterns of an inductor element according to a comparative example and a magnetic field generated by the current. In each of the drawings, the distribution of a magnetic field generated by the coil-shaped conductor patterns and 32 is represented by lines of magnetic force. In addition, the direction of the current is represented by a dot symbol and a cross symbol.

As illustrated in FIG. 2A, the inductor element 101 according to the present preferred embodiment generates lines of magnetic force that circulate around adjacent conductor patterns together. That is, adjacent conductor patterns partially define a closed magnetic circuit. Therefore, magnetic fields generated by coils generated by the conductor patterns 31 and 32 are coupled in such a direction that intensifies each other.

In the inductor element according to the comparative example, the conductor pattern 31 and the conductor pattern 32 are wound in the same direction. As illustrated in FIG. 2B, the inductor element according to the comparative example do not generate lines of magnetic force that circulate around adjacent conductor patterns together, and magnetic flux that passes through the coil opening of a coil defined by the conductor pattern 31 and magnetic flux that passes through the coil opening of a coil defined by the conductor pattern 32 are in the same direction. That is, the two coils defined by the conductor patterns 31 and 32 define a closed magnetic circuit. Therefore, magnetic fields generated by the coils defined by the coil-shaped conductor patterns 31 and 32 weaken each other.

Figure 3A:
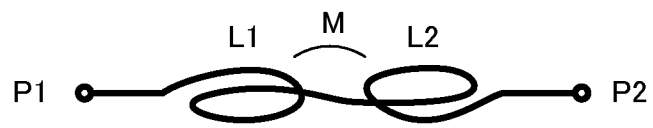
FIG. 3A illustrates self-inductances and a mutual inductance generated by the conductor patterns of the inductor element.
Figure 3B:
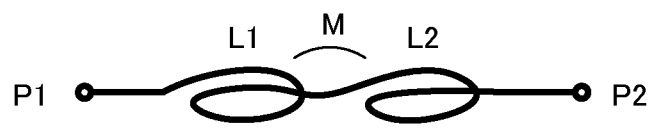
FIG. 3B illustrates self-inductances and a mutual inductance generated by the conductor patterns of the inductor element according to the comparative example.
Figure 3C:
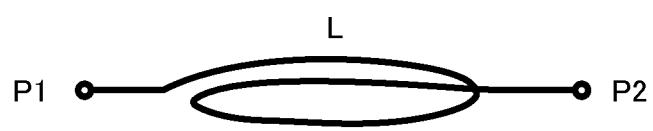
FIG. 3C illustrates a case where a coil having a single coil opening is defined by conductor patterns.

FIG. 3A illustrates self-inductances and a mutual inductance generated by the conductor patterns 31 and 32 of the inductor element 101. Similarly, FIG. 3B illustrates self-inductances and a mutual inductance generated by the conductor patterns 31 and 32 of the inductor element according to the comparative example. FIG. 3C illustrates a case where a coil having a single coil opening is defined by conductor patterns.

Inductors L1 and L2 are equivalent to the conductor patterns 31 and 32, respectively. Ports P1 and P2 are equivalent to the terminal electrodes 21 and 22, respectively. Self-inductances of the conductor patterns 31 and 32 are represented by L1 and L2, respectively. Mutual inductance is represented by M. Then, the inductance between the ports P1 and P2 of the inductor element 101 according to the present preferred embodiment is represented by L1+L2+2M. Meanwhile, the inductance between the ports P1 and P2 of the inductor element according to the comparative example is represented by L1+L2−2M. If a coupling coefficient is represented by k, the relationship between the coupling coefficient k and the inductances described above is represented by the following expression:

$$k^2 = M^2/(L1*L2)$$

In the inductor element 101 according to the present preferred embodiment, in this way, the two coils defined by the conductor patterns 31 and 32 are coupled in such a direction that enhances the inductance. Thus, the inductance between the ports P1 and P2 is high.

In the case where a coil having a single coil opening is defined by a conductor pattern as illustrated in FIG. 3C, if the inductance of the coil is represented by L with L1=L/2 and L2=L/2, the following expression holds true:

$$L < L1+L2+2M$$

Thus, when a comparison is made using approximately the same line length, a high inductance is obtained with a plurality of coils connected in series compared to a single coil. Therefore, the same inductance is obtained with a shorter line length, which accordingly reduces the direct-current resistance (DCR).

If a coil is defined using a conductor pattern with a long line length, in addition, a large potential difference is applied between adjacent lines, which accordingly increases a substantial floating capacitance generated between the lines. If an inductor element is defined by a plurality of coils connected in series as with the inductor element according to the present preferred embodiment, in contrast, a small potential difference is applied between adjacent lines, which reduces a substantial floating capacitance generated between the lines. In addition, the floating capacitances generated by the coils are connected in series, which reduces a substantial total floating capacitance (combined capacitance). Therefore, the inductor element according to the present preferred embodiment has a high self-resonant frequency which is based on the inductance and the floating capacitance of the inductor element.

Figure 4:
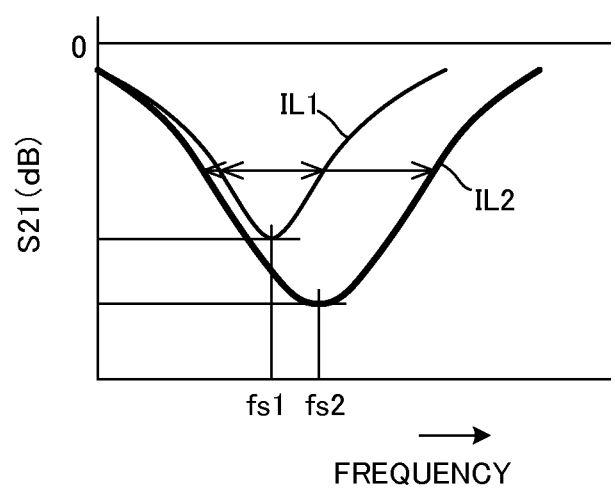
FIG. 4 illustrates the frequency characteristics of the insertion loss (S21) of the inductor element.

FIG. 4 illustrates the frequency characteristics of the insertion loss (S21) of the inductor element. In FIG. 4, a characteristic curve IL1 indicates the characteristics of an inductor element according to a comparative example formed by a single coil, and a characteristic curve IL2 indicates the characteristics of the inductor element 101 according to the present preferred embodiment. In FIG. 4, a frequency fs1 indicates the self-resonant frequency of the inductor element according to the comparative example, and a frequency fs2 indicates the self-resonant frequency of the inductor element 101 according to the present preferred embodiment. As discussed above, the inductor element 101 according to the present preferred embodiment has a high self-resonant frequency compared to the inductor element according to the comparative example. Thus, as illustrated in FIG. 4, the frequency band that allows use as an inductor is widened to a higher range. Therefore, the inductor element removes noise in a higher frequency band in the case where the inductor element is used as a band rejection filter or a low-pass filter that removes a noise component.

When designed to obtain the same self-resonant frequency, a large inductance is obtained because of the small floating capacitance, which reduces the Q value and widens the attenuation bandwidth. Therefore, the rejection bandwidth is widened in the case where the inductor element is used as a band rejection filter that removes a noise component.

Further, the inductor element 101 according to the present preferred embodiment has a small direct-current resistance (DCR) compared to the inductor element according to the comparative example as discussed above, which reduces the insertion loss over the entire frequency band. Therefore, the signal attenuation amount is suppressed. When the insertion loss in the frequency band of the signal is set as a reference (0 dB), the inductor element 101 according to the present preferred embodiment results in a larger insertion loss at the self-resonant frequency as illustrated in FIG. 4.

For example, when applied to a transfer path for transfer of a signal in the UHF band, an inductor with an inductance of 500 nH can be formed to provide an impedance of several hundreds of ohms to several kilohms between the two ports in a frequency band of 700 MHz to 1 GHz. With such characteristics, noise in the frequency band described above is reflected. In this way, the high-frequency filter according to the preferred embodiment is useful as a filter for the UHF band.

Figure 5A:
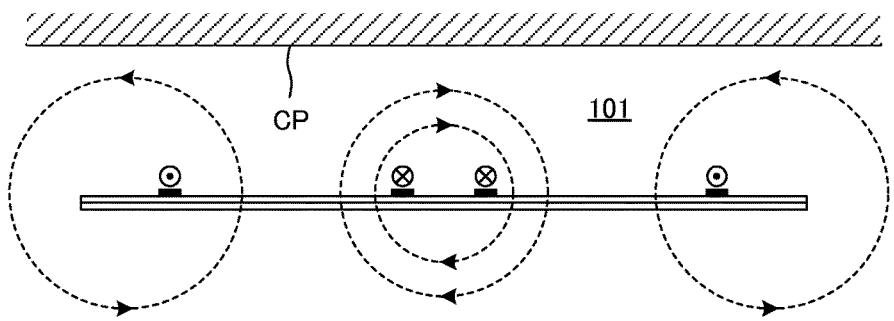
FIG. 5A is a sectional view illustrating the relationship between a magnetic field generated by the conductor patterns of the inductor element and a conductor.
Figure 5B:
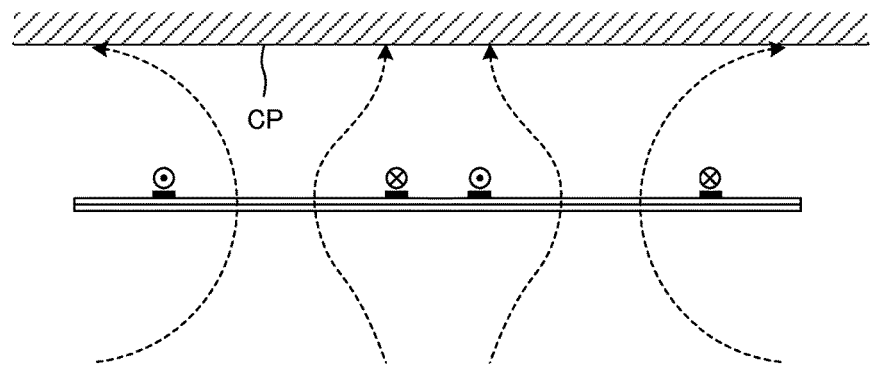
FIG. 5B is a sectional view illustrating the relationship between a magnetic field generated by the conductor patterns of the inductor element according to the comparative example and a conductor.

FIG. 5A is a sectional view illustrating the relationship between a magnetic field generated by a current that flows through the conductor patterns of the inductor element 101 and a conductor. FIG. 5B is a sectional view illustrating the relationship between a magnetic field generated by a current that flows through the conductor patterns of the inductor element according to the comparative example and a conductor. In each of the drawings, the distribution of a magnetic field generated by the coil-shaped conductor patterns and 32 is represented by lines of magnetic force. In addition, the direction of the current is represented by a dot symbol and a cross symbol.

In the case of the inductor element according to the comparative example, the magnetic field generated by the coil conductor patterns define an open magnetic circuit. Thus, if a conductor CP made of non-magnetic metal such as a shield plate of a liquid crystal panel and a battery is proximate, an eddy current flows through the conductor CP, which causes a loss and reduces the inductance. With the inductor element 101 according to the present preferred embodiment, in contrast, the magnetic field generated by the coil conductor patterns define a closed magnetic circuit. Thus, if the conductor CP is proximate, the inductor element 101 is not easily affected. That is, unwanted coupling due to a proximate conductor is significantly reduced or prevented. This allows the inductor element to be disposed in the vicinity of a conductor, which enhances the degree of freedom in arrangement. Thus, it is possible to further reduce the size and the thickness of the inductor element.

Figure 6:
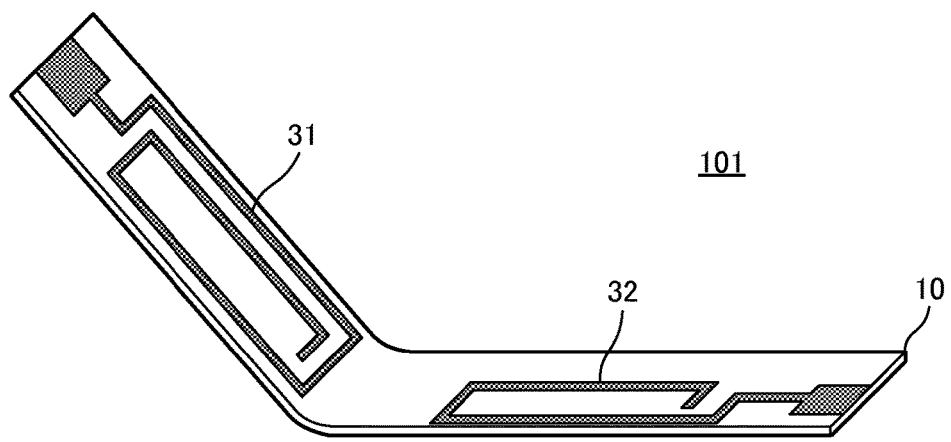
FIG. 6 is a perspective view illustrating a state in which the inductor element is bent.

FIG. 6 is a perspective view illustrating a state in which the inductor element 101 is bent. It should be noted, however, that a resist film is not illustrated in FIG. 6. The inductor element 101 is bent at a location between the coil defined by the conductor pattern 31 and the coil defined by the conductor pattern 32. In the configuration, there are few conductor patterns between the coils, which makes it easy to bend the inductor element. In addition, the rigidity of the conductor patterns 31 and 32 significantly reduces or prevents deformation of the coil portions, which significantly reduces or prevents characteristic variations due to deformation of the coil portions.

Figure 7A:
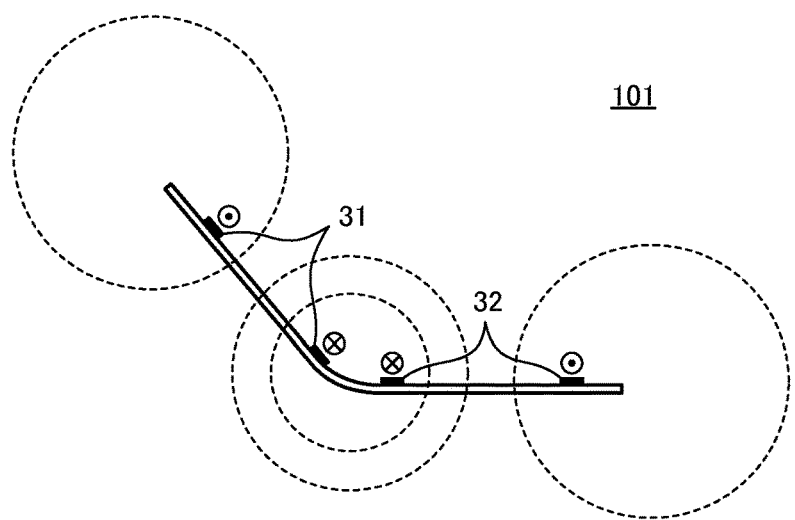
FIG. 7A is a sectional view illustrating the relationship between a current that flows through the conductor patterns of the inductor element and a generated magnetic field.
Figure 7B:
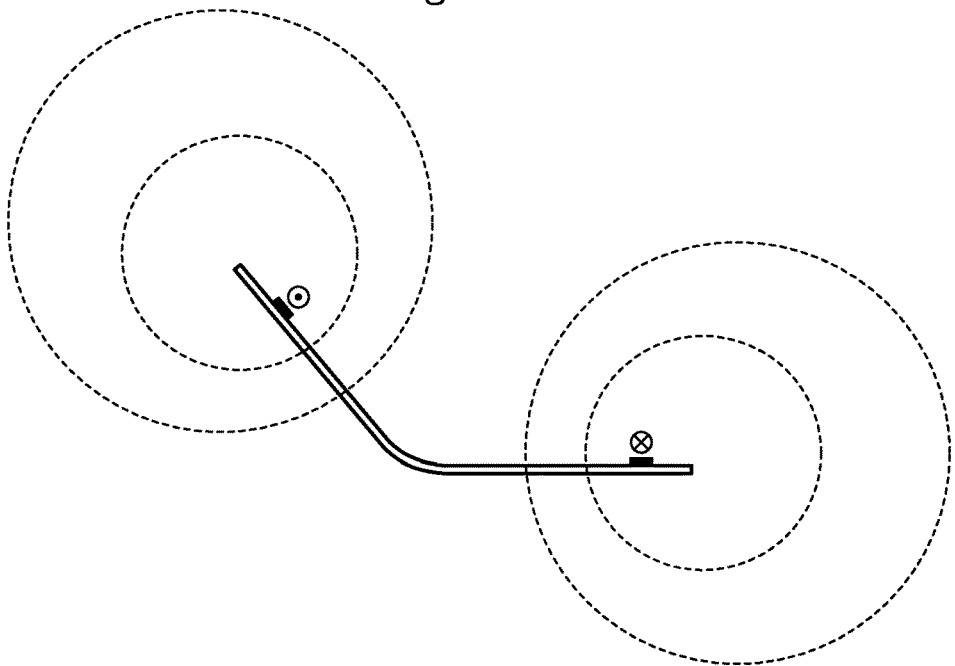
FIG. 7B is a sectional view illustrating the relationship between a current that flows through conductor patterns of an inductor element according to a comparative example and a generated magnetic field.

FIG. 7A is a sectional view illustrating the relationship between a current that flows through the conductor patterns of the inductor element 101 and a generated magnetic field. FIG. 7B is a sectional view illustrating the relationship between a current that flows through conductor patterns of the inductor element according to the comparative example and a generated magnetic field. In the comparative example, the distribution of a magnetic field generated by the conductor pattern defining a single coil is represented by lines of magnetic force. In addition, the direction of the current is represented by a dot symbol and a cross symbol.

As illustrated in FIG. 7B, if a single coil is provided and bent at its center, the entire coil is deformed, which relatively significantly varies the inductance in accordance with the degree of the bend.

As illustrated in FIG. 7A, in contrast, portions of the conductor patterns 31 and 32 provided adjacent to each other are mainly coupled to each other. Thus, the coupling coefficient of the two coils is not significantly varied even in a bent state. Therefore, the inductance is varied only slightly by the bend. In addition, the closed magnetic circuit partially defined by adjacent coils defined by the conductor patterns 31 and 32 is kept even if the inductor element is bent. In an extreme bent state with an interior angle of less than 90°, however, the inductor element 101 is easily affected by a proximate conductor. Thus, the interior angle of the bend is preferably in the range of 180° to 90°, for example.

Second Preferred Embodiment

FIG. 8 is an exploded perspective view of an inductor element 102 according to a second preferred embodiment of the present invention. The inductor element 102 includes an element body 10 and terminal electrodes 21 and 22 provided on the element body 10, and is used with the terminal electrodes 21 and 22 connected to a predetermined circuit.

As illustrated in FIG. 8, the element body 10 is formed preferably by stacking resin substrates 11 and 12 made of a liquid crystal polymer (LCP), for example. Rectangular-spiral (coil-shaped) conductor patterns 31, 32, 34, and 35 are provided on the resin substrate 11. Coils defined by the conductor patterns 31, 32, 34, and 35 each have a coil axis that extends in a direction that is perpendicular or substantially perpendicular to a surface of the resin substrate 11 (in a direction that is perpendicular or substantially perpendicular to the principal surface of the element body 10).

Line-segment conductor patterns 33 and 36 are provided on the resin substrate 12. A first end of the conductor pattern is connected to an inner peripheral end of the conductor pattern 31 by a via conductor (interlayer connection conductor). A second end of the conductor pattern 33 is connected to an inner peripheral end of the conductor pattern 32 by a via conductor. Similarly, a first end of the conductor pattern 36 is connected to an inner peripheral end of the conductor pattern 34 by a via conductor. A second end of the conductor pattern 36 is connected to an inner peripheral end of the conductor pattern 35 by a via conductor.

The arrows in FIG. 8 indicate an example of the directions of currents that flow through the conductor patterns at a certain moment. Magnetic flux that passes through the coil opening of the coils defined by the conductor patterns 31 and 34 is directed downward. Magnetic flux that passes through the coil opening of the coils defined by the conductor patterns 32 and 35 is directed upward. Therefore, lines of magnetic force that circulate around adjacent conductor patterns together are generated. That is, a set of adjacent coils partially define a closed magnetic circuit. Therefore, magnetic fields generated by adjacent coils are coupled in such a direction that intensifies each other.

In this way, three or more coils may be connected in series.

Third Preferred Embodiment

Figure 9:
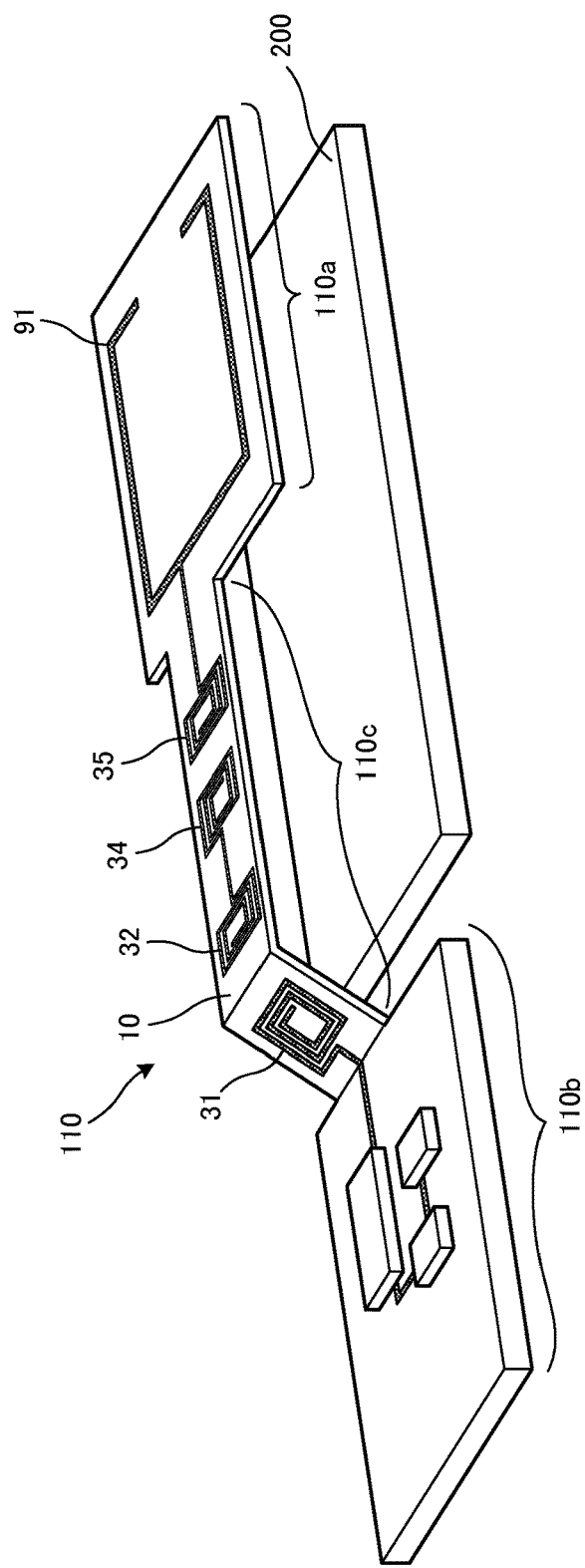
FIG. 9 is a perspective view of a circuit substrate and a high-frequency circuit module disposed in a housing of an electronic device.

A third preferred embodiment of the present invention provides an example of a high-frequency circuit module that includes an inductor element. FIG. 9 is a perspective view of a circuit substrate 200 and a high-frequency circuit module 110 disposed in a housing of an electronic device.

The high-frequency circuit module 110 includes a resin substrate made of a liquid crystal polymer (LCP). An antenna portion 110a, a component mounting portion 110b, and an inductor portion 110c are defined by an integral stacked body. The antenna portion 110a includes an antenna element pattern 91 provided on the element body 10, and defines and functions as a multi-band antenna. The component mounting portion 110b includes components such as a radio-frequency integrated circuit (RFIC) mounted on the element body 10 to define a high-frequency circuit. The inductor portion 110c includes conductor patterns that are similar to the conductor patterns illustrated in FIG. 8 to define and function as an inductor element.

As illustrated in FIG. 9, various components are mounted on the component mounting portion 110b. The antenna portion 110a and the inductor portion 110c are disposed on the circuit substrate 200. The component mounting portion 110b is preferably thicker than the antenna portion 110a and the inductor portion 110c, and used as a rigid sub substrate. The inductor portion 110c is flexible, and bent at a location between a portion on which the conductor pattern 31 is provided and a portion on which the conductor pattern 32 is provided.

As illustrated in FIGS. 8 and 9, the line-segment conductor pattern 33 is positioned on the inner side of the bend. With such a structure, only a small tensile stress is applied to the line-segment conductor pattern 33 even when the element body 10 is bent, which significantly reduces or prevents a break of the line-segment conductor pattern 33.

In this way, the inductor element may be partially provided on the element body to be disposed along a space in a housing.

Fourth Preferred Embodiment

Figure 10:
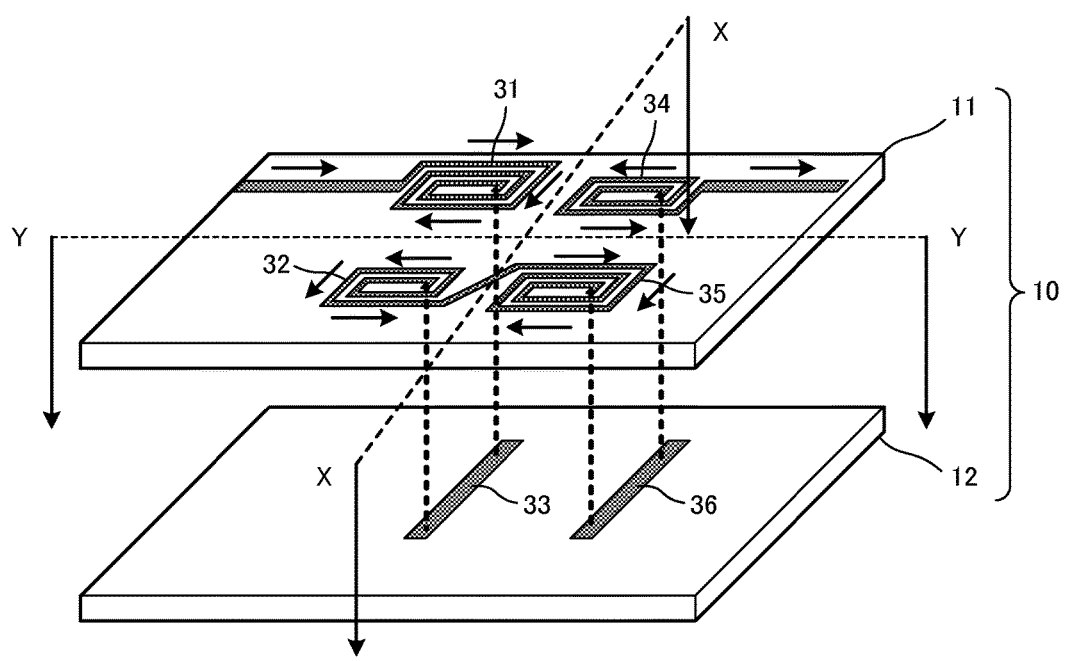
FIG. 10 is an exploded perspective view of an inductor element according to a fourth preferred embodiment of the present invention.

FIG. 10 is an exploded perspective view of an inductor element 104 according to a fourth preferred embodiment of the present invention. The inductor element 104 includes conductor patterns 31 to 36 provided on the element body 10. Rectangular-spiral (coil-shaped) conductor patterns 31, 32, 34, and 35 are provided on the resin substrate 11. Coils defined by the conductor patterns 31, 32, 34, and 35 each have a coil axis that extends in a direction that is perpendicular or substantially perpendicular to a surface of the resin substrate 11 (in a direction that is perpendicular or substantially perpendicular to the principal surface of the element body 10).

Line-segment conductor patterns 33 and 36 are provided on the resin substrate 12. A first end of the conductor pattern is connected to an inner peripheral end of the conductor pattern 31 by a via conductor (interlayer connection conductor). A second end of the conductor pattern 33 is connected to an inner peripheral end of the conductor pattern 32 by a via conductor. Similarly, a first end of the conductor pattern 36 is connected to an inner peripheral end of the conductor pattern 34 by a via conductor. A second end of the conductor pattern 36 is connected to an inner peripheral end of the conductor pattern 35 by a via conductor.

The arrows in FIG. 10 indicate an example of the directions of currents that flow through the conductor patterns at a certain moment. Magnetic flux that passes through the coil opening of the coils defined by the conductor patterns 31 and 35 is directed downward. Magnetic flux that passes through the coil opening of the coils defined by the conductor patterns 32 and 34 is directed upward. Therefore, lines of magnetic force that circulate around adjacent conductor patterns together are generated. That is, a set of adjacent coils partially define a closed magnetic circuit. Therefore, magnetic fields generated by adjacent coils are coupled in such a direction that intensifies each other.

In the case where the inductor element 104 illustrated in FIG. 10 is bent, the inductor element 104 may be bent along the X-X line or the Y-Y line in the drawing.

In this way, a plurality of coils may be disposed in a vertical and horizontal arrangement. If conductor patterns defining a plurality of coils are arranged not in only one direction but in a planar direction, the integration degree is increased to allow the inductor element to be easily disposed in a slight space inside a housing or a gap between a substrate and an adjacent member, for example.

Fifth Preferred Embodiment

Figure 11:
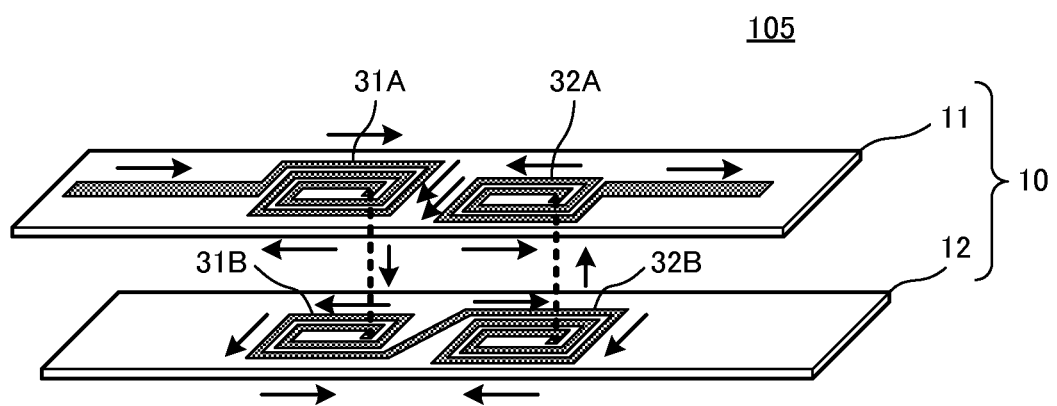
FIG. 11 is an exploded perspective view of an inductor element according to a fifth preferred embodiment of the present invention.

FIG. 11 is an exploded perspective view of an inductor element 105 according to a fifth preferred embodiment of the present invention. The element body 10 is preferably formed by stacking the resin substrates 11 and 12. Rectangular-spiral (coil-shaped) conductor patterns 31A and 32A are formed on the resin substrate 11. Rectangular-spiral (coil-shaped) conductor patterns 31B and 32B are provided on the resin substrate 12. An inner peripheral end of the conductor pattern 31A is connected to an inner peripheral end of the conductor pattern 31B by a via conductor (interlayer connection conductor). An outer peripheral end of the conductor pattern 31B is connected to an outer peripheral end of the conductor pattern 32B. An inner peripheral end of the conductor pattern 32B is connected to an inner peripheral end of the conductor pattern 32A by a via conductor.

A coil defined by the conductor patterns 31A and 31B and a coil defined by the conductor patterns 32A and 32B each have a coil axis that extends in a direction that is perpendicular or substantially perpendicular to a surface of the element body 10.

The arrows in FIG. 11 indicate an example of the directions of currents that flow through the conductor patterns at a certain moment. Magnetic flux that passes through the coil opening of the coils defined by the conductor patterns 31A and 31B is directed downward. Magnetic flux that passes through the coil opening of the coils defined by the conductor patterns 32A and 32B is directed upward. Therefore, lines of magnetic force that circulate around adjacent conductor patterns together are generated. That is, a set of adjacent coils partially define a closed magnetic circuit. Therefore, magnetic fields generated by adjacent coils are coupled in such a direction that intensifies each other.

In this way, the coils preferably are provided over a plurality of layers.

Sixth Preferred Embodiment

Figure 12:
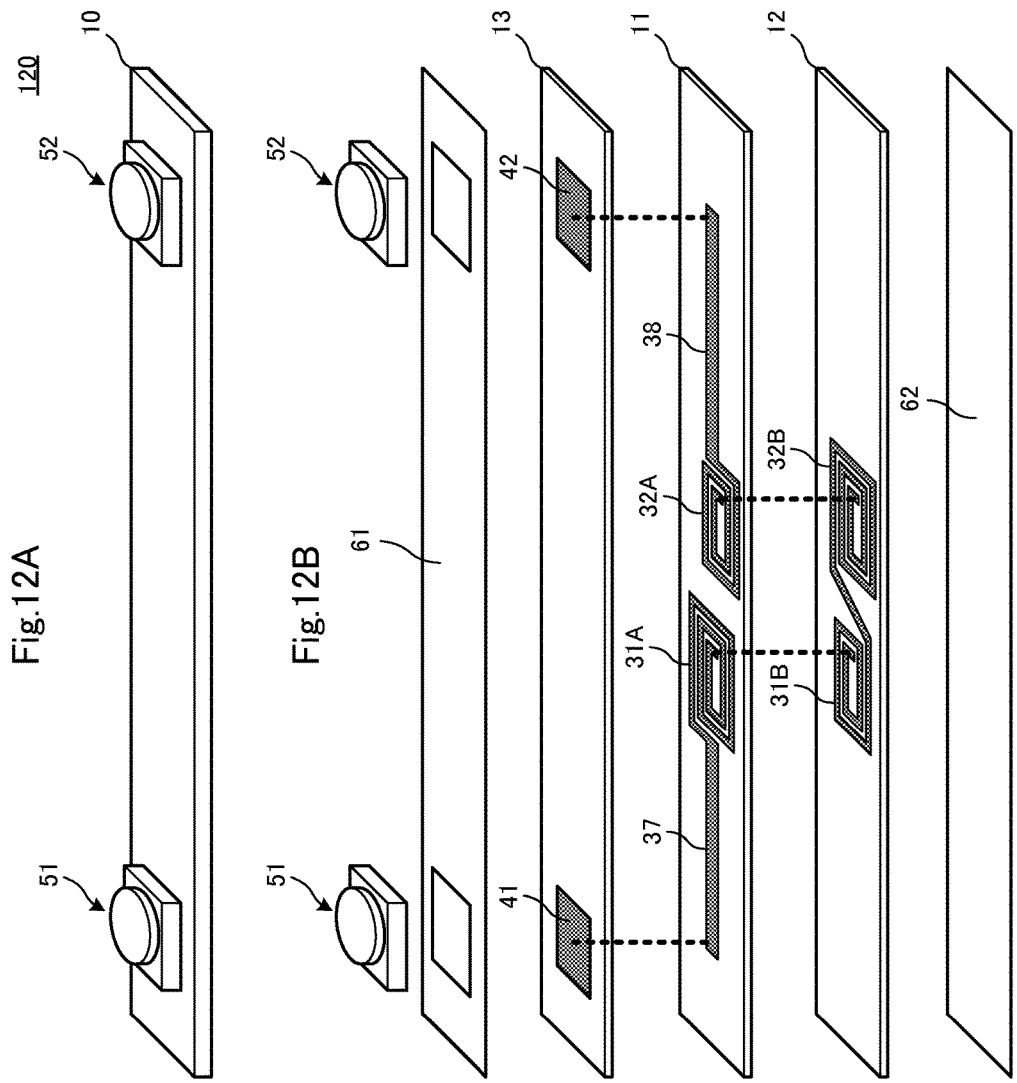
FIG. 12A is a perspective view illustrating the appearance of an inductor bridge according to a sixth preferred embodiment of the present invention.
FIG. 12B is an exploded perspective view of the inductor bridge.

FIG. 12A is a perspective view illustrating the appearance of an inductor bridge according to a sixth preferred embodiment of the present invention. FIG. 12B is an exploded perspective view of the inductor bridge. The inductor bridge 120 is an element that connects between a first circuit and a second circuit through bridge connection. As illustrated in FIG. 12A, the inductor bridge 120 includes a flat and flexible element body 10, and a first connector 51 and a second connector 52 that define and function as conductive members. An inductor portion to be discussed later is provided inside the element body 10. The first connector 51 is provided at a first end portion of the element body 10, and connected to the first circuit through mechanical contact. The second connector 52 is provided at a second end portion of the element body 10, and connected to the second circuit through mechanical contact.

As illustrated in FIG. 12B, the element body 10 is formed preferably by stacking resin substrates 11, 12, and 13 made of a liquid crystal polymer (LCP). Conductor patterns 31A and 32A are provided on the resin substrate 11. Conductor patterns 31B and 32B are provided on the resin substrate 12. The configuration of the conductor patterns on the resin substrates 11 and 12 are similar to those in the inductor element illustrated in FIG. 11 in relation to the fifth preferred embodiment.

Connector mounting electrodes 41 and 42 to mount the connectors 51 and 52, respectively, are provided on the resin substrate 13. The connector mounting electrodes 41 and 42 are connected to end portions of wiring patterns 37 and 38, respectively, by a via conductor.

A resist layer 61 is provided on the upper surface of the resin substrate 13. A resist layer 62 is provided on the lower surface of the resin substrate 12. The resist layers 61 and 62 are not essential, and may be provided as necessary.

In this way, an inductor element with connectors is used as an inductor bridge. The conductive members are not limited to connectors, and may be metal members having a hole to retain a pin at the center portion.

Figure 13:
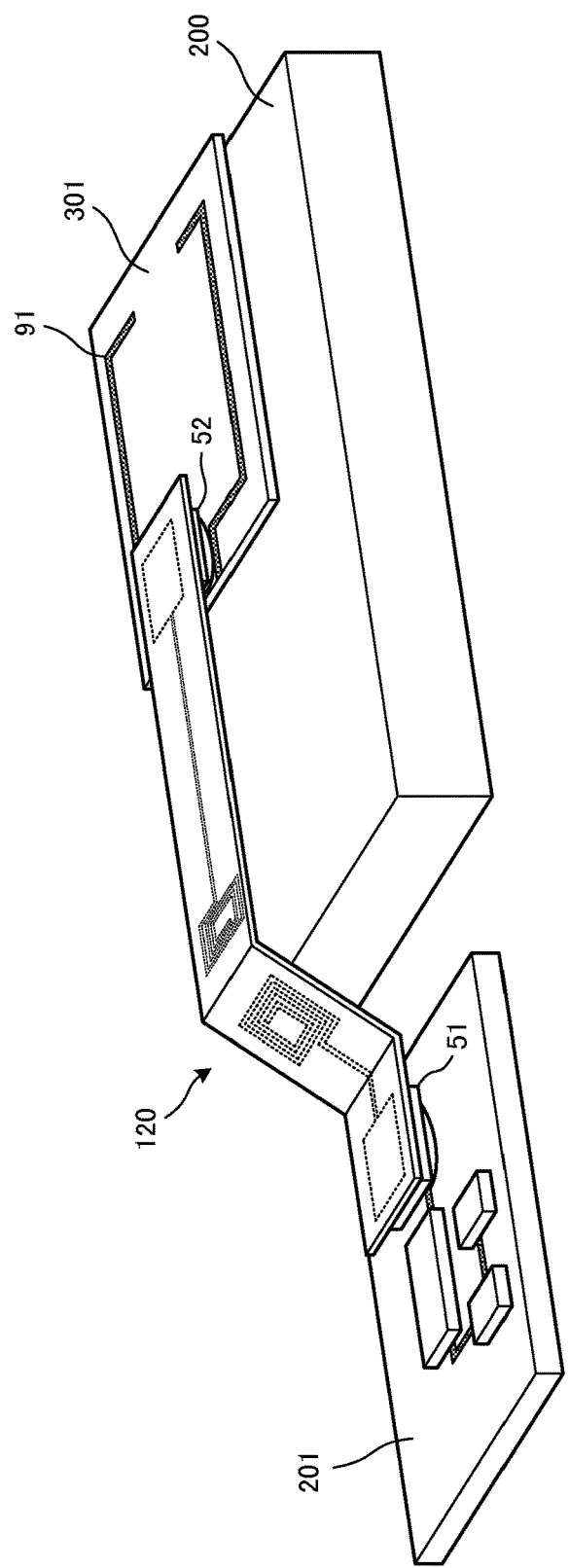
FIG. 13 is a perspective view illustrating an application example of the inductor bridge.

FIG. 13 is a perspective view illustrating an application example of the inductor bridge 120. In FIG. 13, the antenna element pattern 91 is provided on an antenna substrate 301. The second connector 52 of the inductor bridge 120 is connected to a power feed point of the antenna element pattern 91 or a location routed from the power feed point. The antenna substrate 301 is disposed on the circuit substrate 200. The first connector 51 of the inductor bridge 120 is connected to a connection portion provided on the upper surface of a substrate 201 to be electrically connected to an external circuit such as an RFIC disposed on the upper surface of the substrate 201.

Seventh Preferred Embodiment

Figure 14:
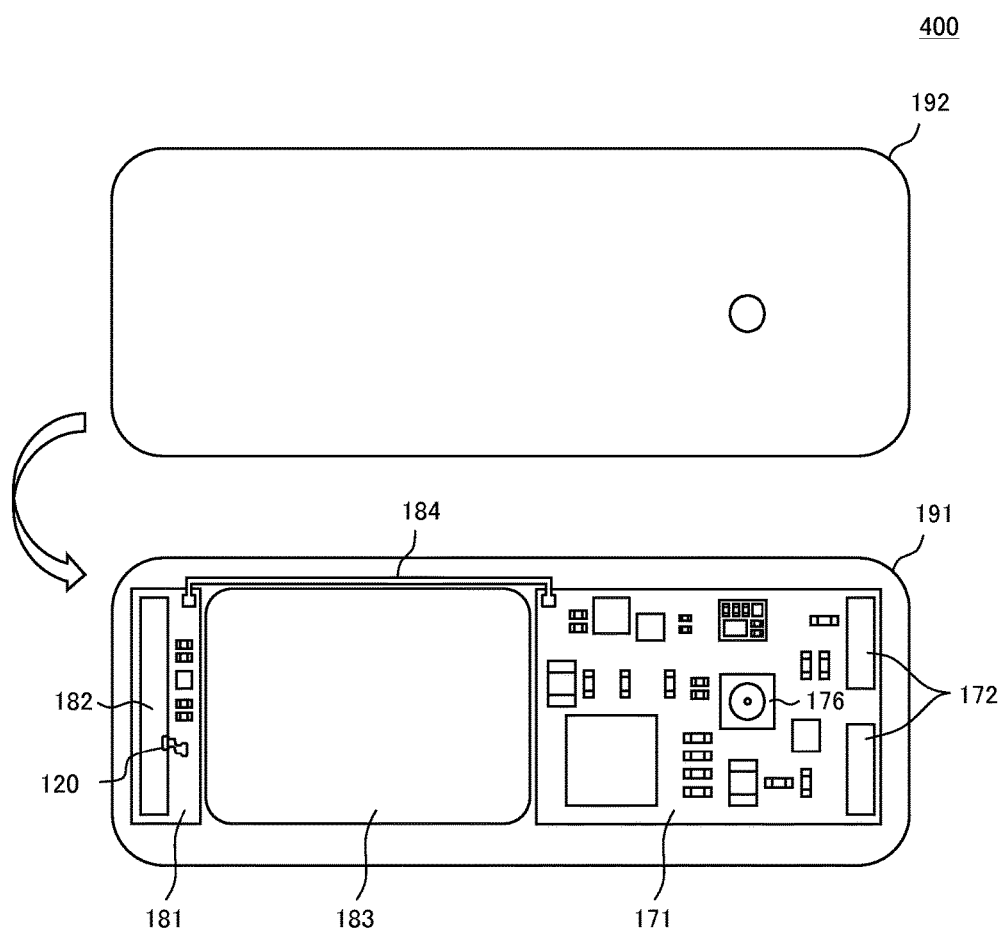
FIG. 14 is a plan view illustrating the structure inside a housing of an electronic device according to a seventh preferred embodiment of the present invention, illustrating a state in which an upper housing and a lower housing are separated from each other to expose the inside.

FIG. 14 a plan view illustrating the structure inside a housing of an electronic device 400 according to a seventh preferred embodiment of the present invention, illustrating a state in which an upper housing 191 and a lower housing 192 are separated from each other to expose the inside. The electronic device 400 is a cellular phone terminal or a tablet personal computer (PC), for example, and includes the inductor bridge 120 illustrated in FIGS. 12A and 12B.

Printed wiring boards 171 and 181, a battery pack 183, and so forth are housed inside the upper housing 191. A UHF-band antenna 172, a camera module 176, and so forth are mounted on the printed wiring board 171. A UHF-band antenna 182 etc. are mounted on the printed wiring board 181. The printed wiring board 171 and the printed wiring board 181 are connected to each other via a cable 184.

The printed wiring board 181 and the antenna 182 are connected to each other by the inductor bridge 120. The configuration of the inductor bridge 120 is as illustrated in FIGS. 12A and 12B.

The inductor bridge may be applied to the cable 184 which connects between the printed wiring boards 171 and 181.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An inductor element comprising:
   an insulating substrate including a conductor pattern; and
   a coil defined by the conductor pattern; wherein
   the coil includes a plurality of coils located on an identical principal surface of the insulating substrate and connected in series;
   a winding direction and a connection of the coils are such that coils of the plurality of coils that are adjacent on the identical principal surface define a closed magnetic circuit;
   the insulating substrate is bent such that an interior angle between coils of the plurality of coils that are adjacent in a planar direction of the principal surface is in a range of 180° to 90°; and
   the coils are provided over a plurality of layers.

2. The inductor element according to claim 1, further comprising:
   a line-segment conductor pattern that connects between coils of the plurality of coils; wherein
   the line-segment conductor pattern is provided in a layer that is different from a layer in which the coils connected by the line-segment conductor pattern are provided, and the insulating substrate is bent such that the line-segment conductor pattern is provided on an inner peripheral side with respect to the layer in which the coils connected by the line-segment conductor pattern are provided.

3. The inductor element according to claim 1, wherein the inductor element defines one of a band rejection filter and a low-pass filter.

4. The inductor element according to claim 1, wherein each of the plurality of coils has a coil axis that extends in a direction that is perpendicular or substantially perpendicular to a surface of the insulating substrate.

5. The inductor element according to claim 1, further comprising a total of two coils.

6. The inductor element according to claim 1, further comprising a total of three or more coils connected in series.

7. The inductor element according to claim 1, wherein the plurality of coils are disposed in a vertical and horizontal arrangement such that each of the conductor patterns defining the plurality of coils are arranged not in a planar direction and another direction.

8. An inductor bridge comprising:
   the inductor element according to claim 1; and
   a conductive member that is continuous with the inductor element.

9. The inductor bridge according to claim 8, further comprising:
   a line-segment conductor pattern that connects between coils of the plurality of coils; wherein
   the line-segment conductor pattern is provided in a layer that is different from a layer in which the coils connected by the line-segment conductor pattern are provided, and the insulating substrate is bent such that the line-segment conductor pattern is provided on an inner peripheral side with respect to the layer in which the coils connected by the line-segment conductor pattern are provided.

10. A high-frequency filter comprising:
    the inductor element according to claim 1; wherein
    a self-resonant frequency determined by an inductance and a floating capacitance generated by the plurality of coils is included in a rejection band.

11. The high frequency filter according to claim 10, further comprising:
    a line-segment conductor pattern that connects between coils of the plurality of coils; wherein
    the line-segment conductor pattern is provided in a layer that is different from a layer in which the coils connected by the line-segment conductor pattern are provided, and the insulating substrate is bent such that the line-segment conductor pattern is provided on an inner peripheral side with respect to the layer in which the coils connected by the line-segment conductor pattern are provided.

12. A high-frequency circuit module comprising:
    an antenna portion including an antenna pattern;
    a component mounting portion including a radio-frequency integrated circuit; and
    an inductor portion including the inductor element according to claim 1.

13. The high-frequency circuit module according to claim 12, wherein the component mounting portion is thicker than the antenna portion and the inductor portion.

14. The high-frequency circuit module according to claim 12, further comprising:
    a line-segment conductor pattern that connects between coils of the plurality of coils; wherein
    the line-segment conductor pattern is provided in a layer that is different from a layer in which the coils connected by the line-segment conductor pattern are provided, and the insulating substrate is bent such that the line-segment conductor pattern is provided on an inner peripheral side with respect to the layer in which the coils connected by the line-segment conductor pattern are provided.

15. An electronic component comprising:
the inductor bridge according to claim 8;
a printed wiring board; and
an antenna; wherein
the printed wiring board and the antenna are connected to each other by the inductor bridge.

16. The electronic component according to claim 15, wherein the electronic component is one of a phone and a computer.

* * * * *